(12) United States Patent
Kim et al.

(10) Patent No.: US 10,893,613 B2
(45) Date of Patent: Jan. 12, 2021

(54) MANUFACTURING METHOD FOR PRINTED CIRCUIT BOARD

(71) Applicant: Samsung Electro-Mechanics Co., Ltd., Suwon-Si (KR)

(72) Inventors: Jong-Guk Kim, Suwon-si (KR); Chul-Min Lee, Suwon-si (KR); Sung-Jun Park, Suwon-si (KR); Dong-Chul Shin, Suwon-si (KR); Chang-Jae Lee, Suwon-si (KR); Seon-Hye Kim, Suwon-si (KR); Joong-Mo Hwang, Suwon-si (KR); Sim-Hwan Park, Suwon-si (KR); Myung-Gun Chong, Suwon-si (KR); Tae-Wook Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 316 days.

(21) Appl. No.: 15/825,511

(22) Filed: Nov. 29, 2017

(65) Prior Publication Data
US 2018/0153043 A1 May 31, 2018

(30) Foreign Application Priority Data
Nov. 29, 2016 (KR) .................. 10-2016-0160463

(51) Int. Cl.
*H05K 3/06* (2006.01)
*H05K 3/00* (2006.01)
(Continued)

(52) U.S. Cl.
CPC ............. *H05K 3/06* (2013.01); *H05K 1/0306* (2013.01); *H05K 1/09* (2013.01); *H05K 3/002* (2013.01);
(Continued)

(58) Field of Classification Search
CPC ...... C23C 22/00; H05K 3/0058; H05K 3/007; H05K 3/02; H05K 3/10; H05K 1/09;
(Continued)

(56) References Cited

U.S. PATENT DOCUMENTS 4,499,152 A * 2/1985 Green .................. H05K 3/025
428/448
4,604,160 A * 8/1986 Murakami ............ H01F 41/042
156/150

(Continued)

FOREIGN PATENT DOCUMENTS

JP          11074643 A    *  3/1999
JP          2011-040728 A    2/2011
KR    10-2007-0021631 A     2/2007

*Primary Examiner* — Carl J Arbes
(74) *Attorney, Agent, or Firm* — NSIP Law

(57) ABSTRACT

A manufacturing method for a printed circuit board includes: transferring roughness of a metal film to an insulating layer by laminating the metal film on the insulating layer, the metal film having the roughness formed on one surface thereof and having a discrete metal layer laminated thereon; exposing a surface of the insulating layer, on which the roughness is transferred, by removing the metal film; processing the surface of the insulating layer having the roughness formed thereon with an acidic solution; and forming a circuit pattern on the insulating layer by a plating process.

13 Claims, 5 Drawing Sheets

(51) Int. Cl.
 *H05K 3/40* (2006.01)
 *H05K 1/03* (2006.01)
 *H05K 1/09* (2006.01)
 *H05K 3/38* (2006.01)
 *H05K 3/18* (2006.01)

(52) U.S. Cl.
 CPC ............ H05K 3/381 (2013.01); H05K 3/388 (2013.01); H05K 3/4038 (2013.01); *H05K 3/181* (2013.01); *H05K 2203/0361* (2013.01); *H05K 2203/0376* (2013.01); *H05K 2203/075* (2013.01); *H05K 2203/0759* (2013.01); *H05K 2203/0789* (2013.01)

(58) Field of Classification Search
 CPC .......... H05K 3/002; H05K 3/06; H05K 3/181; H05K 3/381; H05K 3/388; H05K 3/4038; H05K 2203/0361; H05K 2203/0376; H05K 2203/075; H05K 2203/0759; H05K 2203/0789
 See application file for complete search history.

(56) References Cited

U.S. PATENT DOCUMENTS

| | | | | |
|---|---|---|---|---|
| 4,790,902 A * | 12/1988 | Wada | ................ | H05K 3/205 216/20 |
| 5,501,350 A * | 3/1996 | Yoshida | ................ | C23C 22/63 216/101 |
| 6,242,079 B1 * | 6/2001 | Mikado | ................ | H05K 3/383 428/209 |
| 7,017,265 B2 * | 3/2006 | Tani | ................ | H05K 3/389 29/825 |
| 7,504,719 B2 * | 3/2009 | En | ................ | C23G 1/10 257/700 |
| 7,661,190 B2 * | 2/2010 | Wakisaka | ................ | H05K 3/4661 174/258 |
| 8,076,264 B2 * | 12/2011 | Tsurumi | ................ | C23C 18/30 502/400 |
| 8,382,996 B2 * | 2/2013 | Narahashi | ................ | H05K 3/381 216/13 |
| 8,584,352 B2 * | 11/2013 | Narahashi | ................ | H05K 3/381 29/825 |

* cited by examiner

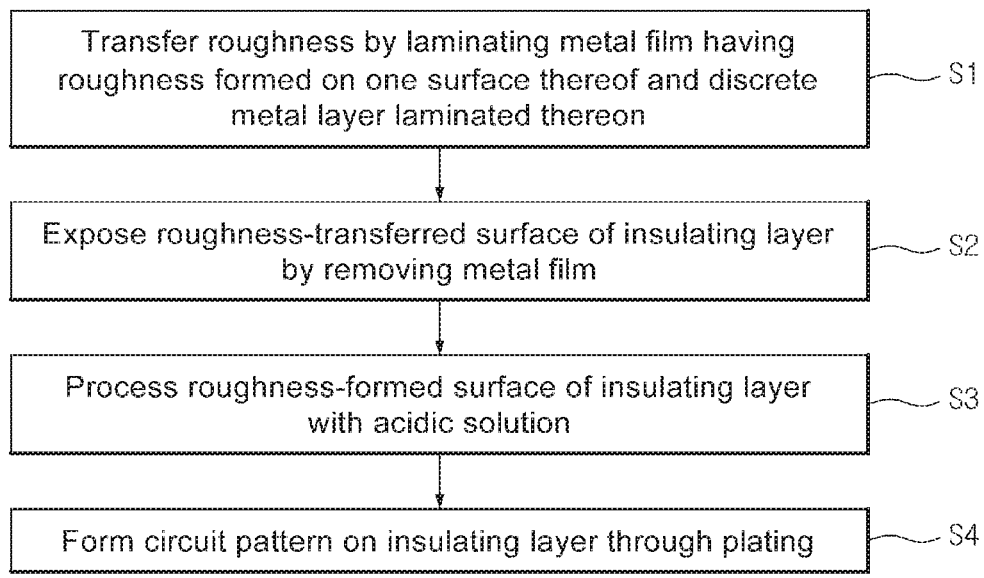
FIG. 1
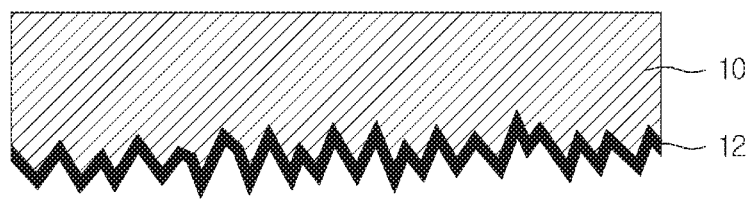
FIG. 2
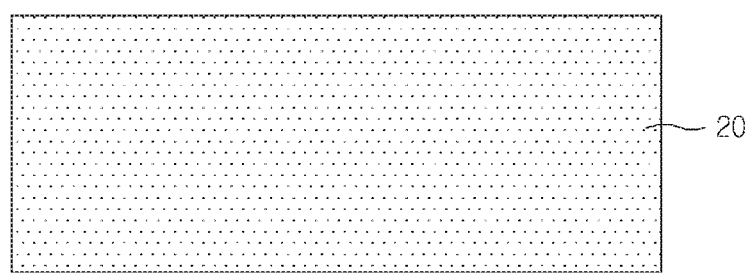

MANUFACTURING METHOD FOR PRINTED CIRCUIT BOARD

CROSS-REFERENCE TO RELATED APPLICATIONS

This application claims the benefit under 35 USC 119(a) of Korean Patent Application No. 10-2016-0160463, filed on Nov. 29, 2016, in the Korean Intellectual Property Office, the entire disclosure of which is incorporated herein by reference for all purposes.

BACKGROUND

1. Field

The following description relates to a manufacturing method for a printed circuit board.

2. Description of Related Art

As the pace of electronic devices becoming smaller have accelerated, the circuits of printed circuit boards have been transforming to microcircuits. Microcircuits are generally fabricated by selectively etching or plating a metal.

Conventionally, in order to form a circuit, a primer has been used to enhance the adhesiveness of a metal to an insulating layer. However, use of the primer has been a cause for an increased cost in the manufacturing of the circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a manufacturing method for a printed circuit board includes: transferring roughness of a metal film to an insulating layer by laminating the metal film on the insulating layer, the metal film having the roughness formed on one surface thereof and having a discrete metal layer laminated thereon; exposing a surface of the insulating layer, on which the roughness is transferred, by removing the metal film; processing the surface of the insulating layer having the roughness formed thereon with an acidic solution; and forming a circuit pattern on the insulating layer by a plating process.

In processing with the acidic solution, the discrete metal layer may be partially removed.

The discrete metal layer may comprise any one or combination of nickel and chrome.

In processing with the acidic solution, 4.0 to 10.0 at % (atomic concentration) of the discrete metal layer may remain on the surface of the insulating layer.

The insulating layer may comprise a polymer chain, and in processing with the acidic solution, the polymer chain may be hydrolyzed.

The polymer chain may comprise an epoxy group, and in processing with the acidic solution, a polar group may be formed by hydrolyzing the epoxy group.

In processing with the acidic solution, sulfuric acid may be coated on the insulating layer, or the insulating layer is soaked in the sulfuric acid.

Prior to exposing the insulating layer: a via hole in the insulating layer having the metal film laminated thereon may be formed; and the via hole may be desmeared.

In processing with the acidic solution, the desmearing of the via hole may be neutralized using a neutralizer.

Other features and aspects will be apparent from the following detailed description, the drawings, and the claims.

BRIEF DESCRIPTION OF DRAWINGS

FIG. 1 is a flow diagram illustrating an example of a method of manufacturing a printed circuit board.

FIG. 2 to FIG. 8 illustrate an example of a method of manufacturing a printed circuit board.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 3:
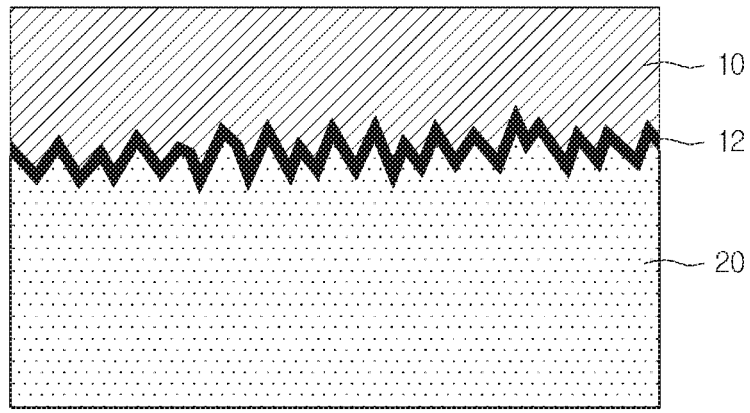

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a flow diagram illustrating an example of a method of manufacturing a printed circuit board, and FIG. 2 to FIG. 8 illustrate an example of a method of manufacturing a printed circuit board.

Referring to FIG. 1, an example of the method for manufacturing a printed circuit board includes transferring the roughness of a surface (S1), exposing an insulating layer (S2), processing with an acidic solution (S3) and forming a circuit pattern (S4).

When transferring the roughness of a surface (S1), a metal film 10 having a rough surface formed thereon is laminated on an insulating layer 20. The insulating layer 20 may be a prepreg material. The roughness of the surface is then transferred onto the insulating layer 20 from the metal film 10. Here, a discrete metal layer 12 that is made of a material different from that of the metal film 10 is laminated on one surface of the metal film 10 on which the rough surface is formed. Since the discrete metal layer 12 is in the form of a thin film, the roughness of the surface is transferred onto the insulating layer 20 while maintaining the rough surface of the discrete metal layer 12.

For example, the metal film 10 may be a copper foil mainly made of copper, and the discrete metal layer 12 may be a layer of thin film containing nickel and/or chrome used for anticorrosion of the copper foil.

Referring to FIG. 2 and FIG. 3, the insulating layer 20 is laminated on the copper foil by pressing a surface of the copper foil having a rough surface formed thereon toward a semi-hardened state of prepreg.

In exposing an insulating layer (S2), a surface of the insulating layer 20 having the rough surface is transferred thereto is exposed by removing the metal film 10. The rough surface formed on the insulating layer 20 functions to enhance the adhesiveness of plating process when a circuit pattern is formed thereon in a subsequent process.

In an example, the metal film 10 is removed by etching the metal film 10. Since the discrete metal layer 12 is made of a material different from that of the metal film 10, the discrete metal layer 12 will remain on the insulating layer 20 after the metal film 10 is etched off.

Figure 4:
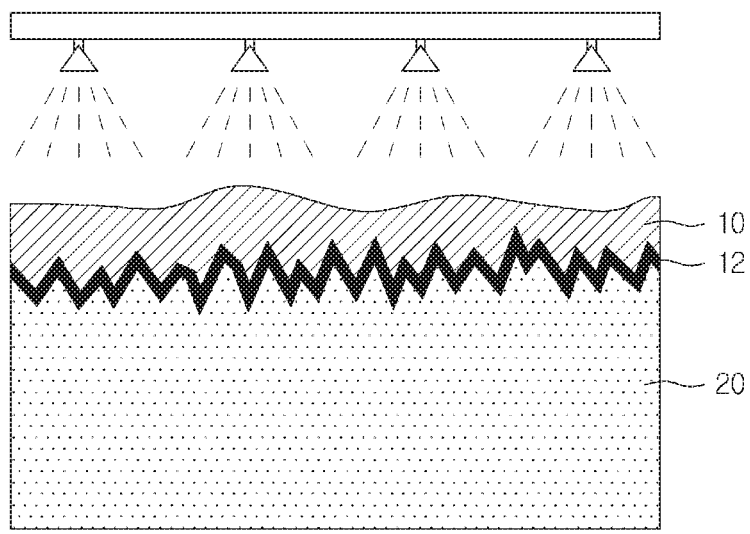
Figure 5:
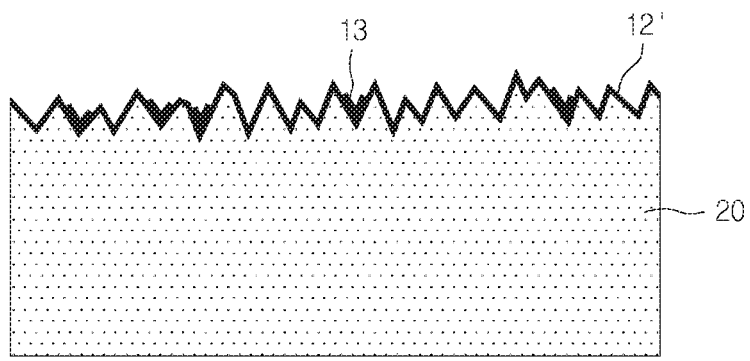

Referring to FIG. 4 and FIG. 5, the copper foil is removed by spraying a copper etchant on the copper foil laminated on an upper surface of the insulating layer 20. An anticorrosive layer containing nickel and/or chrome will remain on the insulating layer 20, and may be thicker in some areas 13 than others.

Although, the metal film 10 is removed using an etching process in this example, the present application is not limited to this method. Various methods of removing the metal film 10 known to those who are skilled in the art may be used. For example, it is possible to exfoliate the metal film 10 after laminating the insulating layer 20.

When processing with an acidic solution (S3), the surface of the insulating layer 20 having the rough surface formed thereon is processed with an acidic solution. The acidic solution removes the remaining areas 13 on the insulating layer 20 where the remaining discrete metal layer 12 is thick. The remaining thick discrete metal layer 12 interferes with proper plating and may result in uneven plating. Therefore, by processing the surface of the insulating layer 20 to have a rough surface formed thereon with an acidic solution prior to proceeding with plating, it is possible to remove the remaining thick discrete metal layer 12, provide a uniform surface for plating and enhance the adhesiveness of the circuit pattern formed through plating.

Moreover, for enhancing the adhesiveness of the plating process, some of the discrete metal layer 12 may remain, rather than completely removing the discrete metal layer 12. For example, about 4.0 to 10.0 at % (atomic concentration) of the discrete metal layer 12 containing nickel and/or chrome may be allowed to remain. Compared to completely removing the discrete metal layer 12 containing nickel and/or chrome, the remaining discrete thin metal layer 12' having said at % is more advantageous for providing a higher plating adhesiveness. Here, the remaining discrete thin metal layer 12' may not cover the surface of the insulating layer 20 completely and may partially expose the insulating layer 20.

Figure 6:
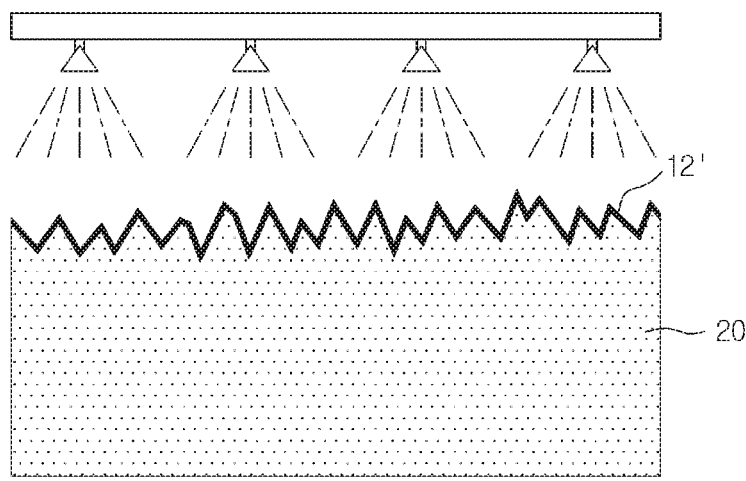

Referring to FIG. 6, the acidic solution, such as hydrochloric acid, sulfuric acid or phosphoric acid, may be coated on the upper surface of the insulating layer 20 having the rough surface formed thereon and nickel and/or chrome remaining thereon.

In processing with an acidic solution (S3), the adhesiveness of the plating process is further enhanced by forming a polar group on the insulating layer 20. In the case where the insulating layer 20 is made of a resin containing a polymer chain, processing with the acidic solution will hydrolyze the polymer chain. The polymer material hydrolyzed on the surface of the insulating layer 20 has a large amount of polar group and, thus, has a force that attracts metal ions during the plating process. Accordingly, the hydrolyzed polymer material will contribute to enhancing the adhesiveness of the plating process. Particularly, when electroless plating is performed, the polar group on the insulating layer 20 interacts with charged metal ions to effect the metal ions to be attached to the insulating layer 20.

For example, it is possible to use an epoxy resin containing an epoxy group as the insulating layer 20 and hydrolyze the epoxy group using 55 wt % sulfuric acid. The sulfuric acid may be coated on the insulating layer 20, or the insulating layer 20 may be soaked in the sulfuric acid.

Figure 7:
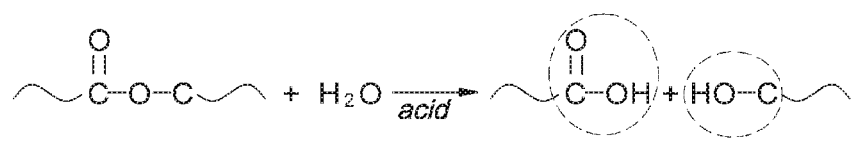

Referring to FIG. 7, the epoxy group refers to a heterocyclic 3-membered ring constituted with 2 carbon atoms and 2 oxygen atoms processing the epoxy group with an acid solution, such as sulfuric ace, which forms a hydroxyl group having a high polarity through hydrolysis.

In forming a circuit pattern (S4), a circuit pattern is plated on the insulating layer 20. Through the functions described above, a rough surface is formed on the insulating layer to enhance the adhesiveness of the plating process. The discrete metal layer 12 adjusted to a predetermined thickness on the surface of the insulating layer 20 enhances the adhesiveness of the plating process. Moreover, by forming the polar group on the surface of the insulating layer 20, the adhesiveness of the plating process is further enhanced.

Figure 8:
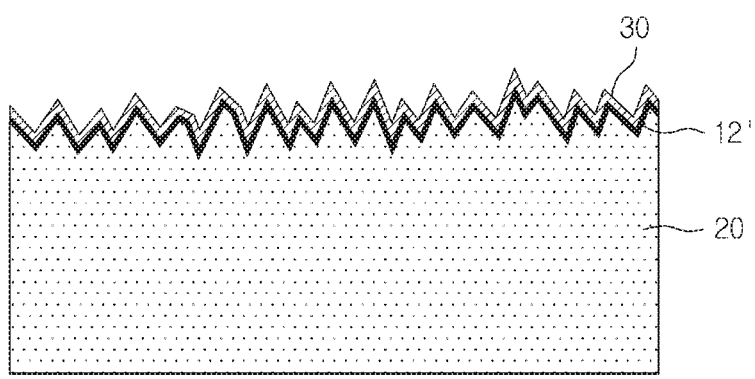

Referring to FIG. 8, a copper-plated layer 30 is formed through electroless plating on the upper surface of the insulating layer 20 on which the discrete metal layer 12 is formed with a rough surface and a predetermined thickness. The polar group has been formed on the upper surface of the insulating layer 20 by the above-described hydrolysis. After the electroless plating, a circuit pattern of a required thickness is readily formed through electroplating.

FIG. 9 to FIG. 13 illustrate another example of a method of manufacturing a printed circuit board. In this example, an internal circuit 125 has been already formed inside the insulating layer 120, and a step for forming a via hole is added to form a via being connected to the internal circuit 125.

For example, prior to the above-described process of exposing an insulating layer (S2), it is possible to further include forming a via hole in the insulating layer 120, on which the metal film 110 is laminated, and desmearing the via hole.

Figure 9:
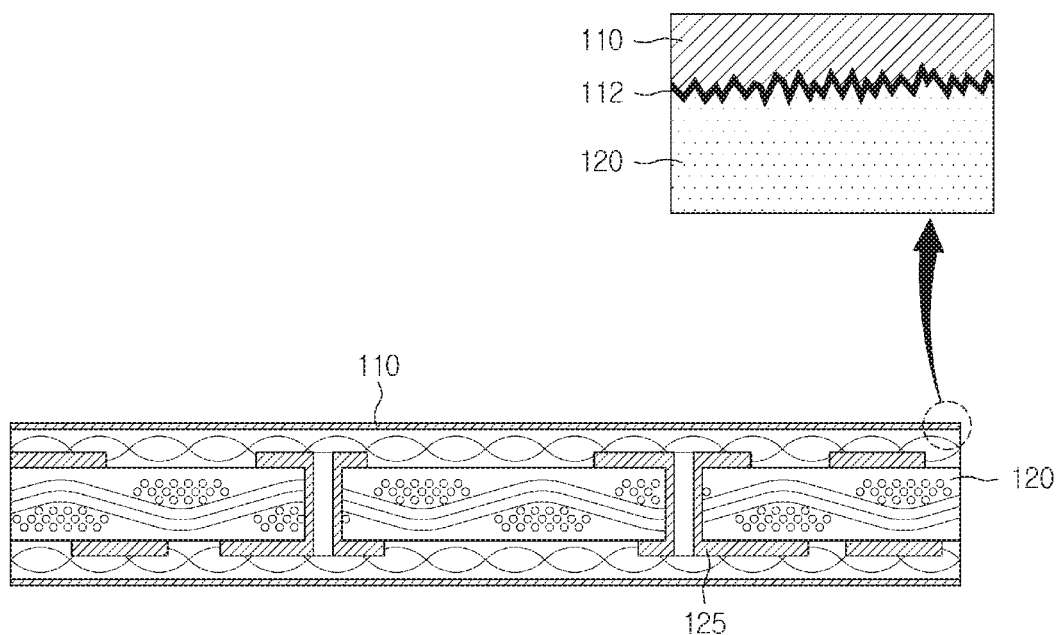
FIG. 9 to FIG. 13 illustrate another example of a method of manufacturing a printed circuit board.
Figure 10:
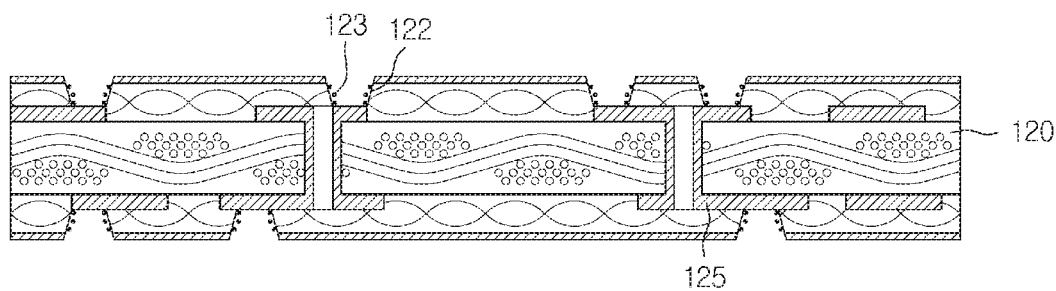

Referring to FIG. 9, a copper foil formed with a rough surface is laminated on the insulating layer 120, in which the internal circuit 125 is formed, to transfer the rough surface to the insulating layer 120. A discrete metal layer 112 made of nickel and/or chrome for anticorrosion is formed on the copper foil. Referring to FIG. 10, a via hole 122 is formed in the metal film 110 and the insulating layer 120 using a laser or machining process. Here, smear 123 is formed inside the via hole 122.

Figure 11:
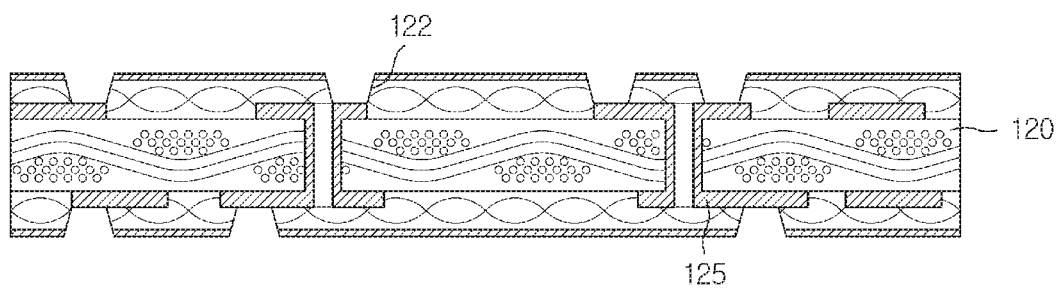

Referring to FIG. 11, a desmear process for the via hole is performed in order to remove the smear 123 formed during the via hole process. Since the upper surface of the insulating layer 120 on which the rough surface is transferred is still covered by the metal film 110, it is possible to prevent the rough surface of the insulating layer 120 from being damaged by the desmear process of the via hole.

After the desmear process of the via hole, the surface of the insulating layer 120 on which the rough surface is formed is exposed by etching off the metal film 110 in the above-described step of exposing an insulating layer (S2).

Figure 12:
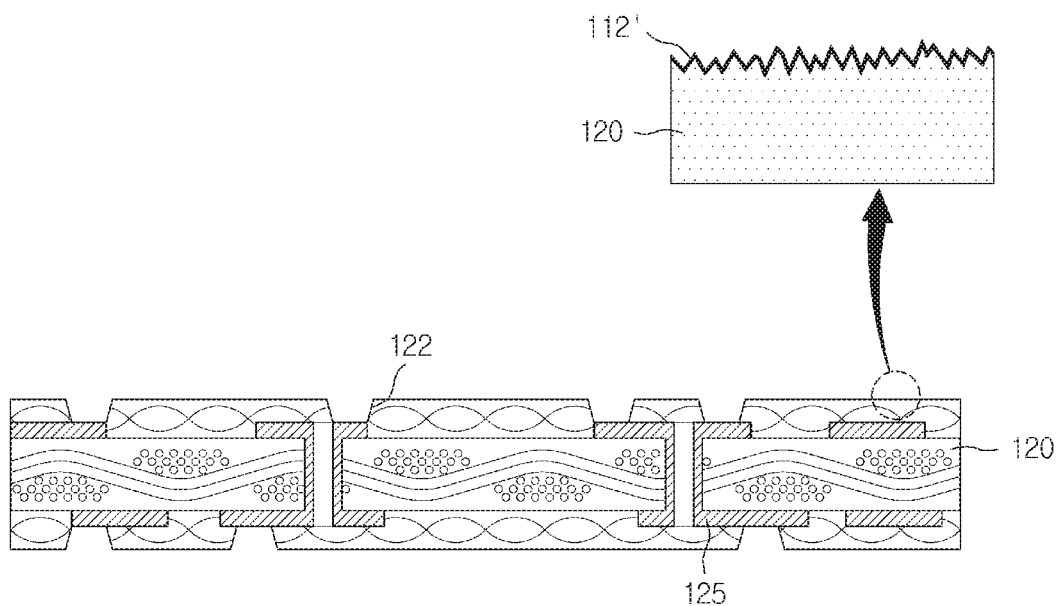

Referring to FIG. 12, through processing with an acidic solution (S3) after etching off the metal film 110, the discrete metal layer 112' made of nickel and/or chrome is adjusted to a predetermined thickness on the insulating layer 120 on which the rough surface is formed, and a polar group may be formed on the surface of the insulating layer 120.

Figure 13:
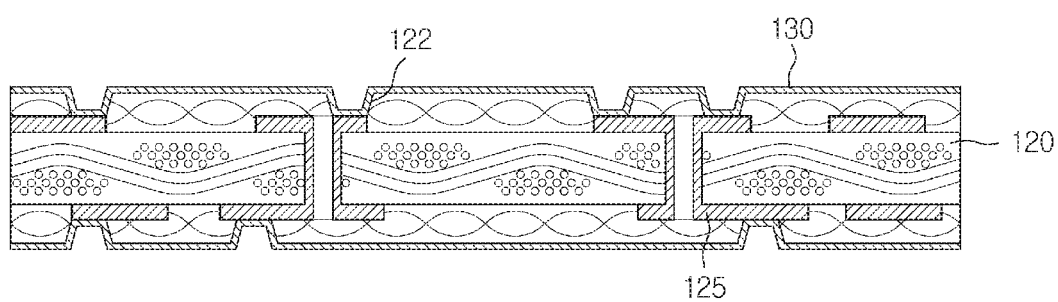

Referring to FIG. 13, a copper-plated layer is formed through electroless plating on the supper surface of the insulating layer 120. After the electroless plating, a circuit pattern of a required thickness is readily formed through electroplating.

In the present example, the copper foil remains covered on the upper surface of the insulating layer 120 while the via hole is formed in the copper foil and the copper foil is desmeared. Accordingly, it is possible to prevent the rough surface of the insulating layer 120 from being damaged by the desmear process and to provide a sufficient adhesiveness for the plating process, owing to the undamaged rough surface, while plating the insulating layer 120.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method for a printed circuit board, comprising:
   laminating a metal film on an insulating layer, the metal film comprising a first metal layer comprising one or more jagged surface having a roughness formed by peaks between valleys, and a second metal layer comprising a first surface in contact with the first metal layer and a second surface in contact with a surface of the insulating layer;
   pressing the metal film toward the insulating layer such that the roughness is transferred to the surface of the insulating layer;
   removing the first metal layer such that the first surface of the second metal layer is exposed; and
   treating the first surface of the second metal layer with an acidic solution such that at least a portion of the second metal layer is removed from the surface of the insulating layer.

2. The manufacturing method of claim 1, further comprising, after treating the first surface of the insulating second metal layer, forming a circuit pattern on the insulating layer by a plating process.

3. The manufacturing method of claim 1, wherein the treating the first surface of the second metal layer comprises partially removing the second metal layer from the surface of the insulating layer.

4. The manufacturing method of claim 3, wherein the second metal layer comprises any one or combination of nickel and chrome.

5. The manufacturing method of claim 3, wherein the treating the first surface of the second metal layer comprises maintaining 4.0 to 10.0 at % (atomic concentration) of the second metal layer on the surface of the insulating layer.

6. The manufacturing method of claim 1, wherein the insulating layer comprises a polymer chain, and
   wherein the treating the first surface of the second metal layer comprises hydrolyzing the polymer chain of the insulating layer.

7. The manufacturing method of claim 6, wherein the polymer chain comprises an epoxy group, and
   wherein the treating the first surface of the second metal layer comprises a polar group formed by hydrolyzing the epoxy group of the insulating layer.

8. The manufacturing method of claim 1, wherein the treating the first surface of the second metal layer comprises coating sulfuric acid on the insulating first surface of the second metal layer.

9. The manufacturing method of claim 1, wherein the treating the first surface of the second metal layer comprises soaking the second metal layer in the sulfuric acid.

10. The manufacturing method of claim 1, further comprising, prior to removing the first metal layer:
    forming a via hole in the insulating layer; and
    desmearing the via hole.

11. The manufacturing method of claim 10, wherein the treating the first surface of the second metal layer comprises neutralizing, the desmearing of the via hole using a neutralizer.

12. A manufacturing method for a printed circuit board, comprising:
    laminating a metal film on an insulating layer, the metal film comprising a first metal layer comprising one or more jagged surface having a roughness formed by peaks between valleys, and a second metal layer comprising a first surface in contact with the first metal layer and a second surface in contact with the insulating layer;
    pressing the metal film toward the insulating layer such that the roughness is transferred to the surface of the insulating layer;
    removing the first metal layer such that the first surface of the second metal layer is exposed; and
    treating the first surface of the second metal layer with an acidic solution such that at least a portion of the second metal layer is removed,
    wherein the second surface of the second metal layer is in contact with an entire surface of the insulating layer after the treating.

13. A manufacturing method for a printed circuit board, comprising:
    laminating a metal film on an insulating layer, the metal film comprising a first metal layer comprising one or more jagged surface having a roughness formed by peaks between valleys, and a second metal layer comprising a first surface in contact with the first metal layer and a second surface in contact with a surface of the insulating layer;
    pressing the metal film toward the insulating layer such that the roughness is transferred to the surface of the insulating layer;
    removing the first metal layer such that the first surface of the second metal layer is exposed; and
    coating the first surface of the second metal layer with an acidic solution such that the second metal layer with a uniform thickness is continuously disposed on the insulating layer.

* * * * *